United States Patent
Huang et al.

(10) Patent No.: US 12,402,323 B2
(45) Date of Patent: Aug. 26, 2025

(54) EMBEDDED SEMICONDUCTOR RANDOM ACCESS MEMORY STRUCTURE AND CONTROL METHOD THEREFOR

(71) Applicant: PEKING UNIVERSITY, Beijing (CN)

(72) Inventors: Qianqian Huang, Beijing (CN); Kaifeng Wang, Beijing (CN); Zhiyuan Fu, Beijing (CN); Ru Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 18/279,569

(22) PCT Filed: Aug. 12, 2022

(86) PCT No.: PCT/CN2022/112021
§ 371 (c)(1),
(2) Date: Aug. 30, 2023

(87) PCT Pub. No.: WO2023/087804
PCT Pub. Date: May 25, 2023

(65) Prior Publication Data
US 2024/0306397 A1    Sep. 12, 2024

(30) Foreign Application Priority Data

Nov. 17, 2021 (CN) .......................... 202111362432.3

(51) Int. Cl.
*H10B 53/30* (2023.01)
*G11C 11/22* (2006.01)

(52) U.S. Cl.
CPC ............ *H10B 53/30* (2023.02); *G11C 11/221* (2013.01); *G11C 11/2259* (2013.01); *G11C 11/2273* (2013.01); *G11C 11/2275* (2013.01)

(58) Field of Classification Search
CPC ... H10B 53/30; G11C 11/221; G11C 11/2259; G11C 11/2273; G11C 11/2275;
(Continued)

(56) References Cited

U.S. PATENT DOCUMENTS

| 11,888,019 B2* | 1/2024 | Treger .................. H10D 1/692 |
| 2005/0135143 A1* | 6/2005 | Jeon ........................ G11C 11/22 365/145 |

(Continued)

FOREIGN PATENT DOCUMENTS

| CN | 101777572 A | 7/2010 |
| CN | 102185108 A | 9/2011 |
| CN | 114171081 A | 3/2022 |

OTHER PUBLICATIONS

International Search Report and Written Opinion (both in English and Chinese) of the ISA issued in PCT/CN2022/112021, mailed Oct. 26, 2022; ISA/CN.

*Primary Examiner* — Fernando Hidalgo
(74) *Attorney, Agent, or Firm* — Harness, Dickey & Pierce, P.L.C.

(57) ABSTRACT

Disclosed is an embedded semiconductor random access memory structure, including a hafnium oxide-based ferroelectric storage element suitable for storing information, and a tunneling field effect transistor connected to the storage element. The tunneling field effect transistor is suitable for controlling the hafnium oxide-based ferroelectric storage element to perform read and write operations. A semiconductor memory array can be formed by repeating the above memory structures. A control method for the memory structure includes steps of writing 0, writing 1, reading, and writing back.

7 Claims, 7 Drawing Sheets

(58) Field of Classification Search
CPC ... G11C 11/22; G11C 11/223; G11C 11/2255; G11C 11/2257; G11C 11/5657; G11C 11/409; G11C 5/147; G11C 7/12; G11C 8/08
USPC .......................................................... 365/145
See application file for complete search history.

(56) References Cited

U.S. PATENT DOCUMENTS

| | | | |
|---|---|---|---|
| 2009/0233382 A1* | 9/2009 | Moise, IV ............. | H10D 1/682 257/E21.001 |
| 2012/0127776 A1* | 5/2012 | Kawashima ........ | G11C 11/2273 365/145 |
| 2014/0003122 A1 | 1/2014 | Wang et al. | |
| 2016/0104769 A1* | 4/2016 | Verreck ................. | H10D 84/85 257/9 |

* cited by examiner

EMBEDDED SEMICONDUCTOR RANDOM ACCESS MEMORY STRUCTURE AND CONTROL METHOD THEREFOR

CROSS-REFERENCE TO RELATED APPLICATIONS

This application is a U.S. National Phase application under 35 U.S.C. 371 of International Application No. PCT/CN2022/112021, filed on Aug. 12, 2022, which claims the benefit of Chinese Patent Application No. 202111362432.3, filed on Nov. 17, 2021. The entire disclosures of the above applications are expressly incorporated by reference herein.

FIELD OF THE INVENTION

The present disclosure relates to the technical field of semiconductor memories, and in particular, to an embedded random access memory structure and a control method therefor.

BACKGROUND OF THE INVENTION

From a perspective of a development trend of information technologies, application of integrated circuits with ultra-low power consumption has become a mainstream direction. Portable and implantable chips required for mobile computing and communication, intelligent hardware, the Internet of Things, wearable devices, biomedicine, and the like have already occupied a high proportion in electronic products and are growing rapidly. For a mobile device, power consumption directly affects user experience and reliability of the mobile device. However, as a feature size of the integrated circuit is scaled down continually according to the Moore's Law while power consumption of the integrated circuit is rising, static power consumption may gradually exceed dynamic power consumption, which becomes a bottleneck factor that slows down or limits further development of the semiconductor technology. Therefore, it has become a core problem of the integrated circuit technology how to reduce power consumption of the chip.

A memory is an indispensable component in an electronic information processing system. In the past, with continuous progress of a CMOS technology, performance of the memory has been improved constantly. However, in recent years, on one hand, a problem of transistor leakage due to size miniaturization has become increasingly serious, wherein a retention characteristic of a memory cell is deteriorated while power consumption of the memory is increased. Therefore, the development of the memory encounters a significant bottleneck. On the other hand, for rapid development of artificial intelligence and the Internet of Things, higher requirements are put for figure of merit of the memory such as capacity, speed, and power consumption. Under this background, due to characteristics of an embedded dynamic random access memory (eDRAM), such as high density, wide bandwidth, fast read speed and the like, overall performance of the system can be improved. Therefore, the embedded dynamic random access memory is attracting much attention in recent years.

In order to maintain accuracy of stored information, the dynamic random access memory requires a refresh operation. When a leakage current of the transistor in the memory cell is larger, the stored information is easier to be destroyed, a cycle required for refresh operation is shorter, and power consumption by the refresh operation is higher. To resolve this problem, the transistor structure in the standalone random access memory is specially designed. For example, a buried gate structure is used to increase a channel length and reduce the leakage current. However, the special design of the transistor structure increases process difficulties in integrating with a logic device and implementing embedded storage. For this reason, the following two methods are typically adopted for the embedded dynamic random access memory, one of which is to use a memory cell structure of 1T1C, where the IO device is selected as the control transistor, resulting in an increase of the memory cell and a decrease in storage capacity; The other of which is to use a multi-transistor cell structure, with a gate capacitor of a transistor being used as a storage capacitor. However, a memory window of the latter method is relatively small and its retention performance is poor.

A tunneling field effect transistor (TFET) uses a new conduction mechanism called band-to-band tunneling (BTBT). By controlling a tunneling width of a tunneling junction at an interface between a source end and a channel through a gate electrode, electrons will tunnel from the valence band edge of source to the conduction band edge of channel to form a tunneling current when the device is turned on. And there's no tunneling current when the device is turned off. Therefore, the tunneling field effect transistor significantly reduces an off-state leakage current of the device while breaking through a theorical limit of a sub-threshold slope of a conventional MOSFET, having extremely low static and dynamic power consumption. Therefore, by using a tunneling field effect transistor as the control transistor, a retention characteristic of a memory cell may be improved without the refresh operation on the memory cell, thereby reducing power consumption. Meanwhile, tunneling field effect transistors used for logic and memory circuits have the same structures which are compatible with an existing CMOS process. Therefore, the tunneling field effect transistor-based memory can be integrated into a logic chip without increasing process costs or an area of a memory cell.

A ferroelectric capacitor has greater polarization intensity than a dielectric capacitor of a same volume by a ferroelectric polarization. By using the ferroelectric capacitor as a storage capacitor, in place of a dielectric capacitor or an MOSFET gate capacitor, a larger memory window may be obtained at a same process node, thereby further reducing an cell area and increasing integration. The ferroelectric polarization may maintain original polarization intensity when no voltage is applied. The ferroelectric polarization switching is field driven and a current is generated only during ferroelectric polarization switching. Therefore, excellent characteristics such as low power consumption and long retention time may exhibit by using ferroelectric capacitor as a storage element. In addition, hafnium oxide-based ferroelectric material has advantages of low operating voltage, fast polarization switching speed, good CMOS process compatibility, and good scalability. A hafnium oxide-based ferroelectric capacitor can be fabricated through the CMOS BEOL process to monolithically integrate with tunneling field effect transistor.

SUMMARY OF THE INVENTION

An objective of the present disclosure is to provide an embedded semiconductor random access memory structure and a read and write method thereof. The memory structure uses a special capacitor as a storage element and uses a special transistor as a control transistor to perform operations such as reading and writing. This memory structure can reduce an operating voltage and increase integration density.

To achieve the foregoing objectives, the present disclosure provides an embedded semiconductor random access memory structure. The memory structure includes one hafnium oxide-based ferroelectric capacitor serving as a storage element and one tunneling field effect transistor configured to control the storage element. The hafnium oxide-based ferroelectric capacitor comprises a hafnium oxide-based ferroelectric material layer, a top plate, and a bottom plate. The tunneling field effect transistor includes a source electrode, a drain electrode, a lightly-doped channel region, and a gate electrode. The gate electrode of the tunneling field effect transistor is connected to one of a plurality of word lines, the source electrode is connected to one of a plurality of plate lines, and two terminals of the hafnium oxide-based ferroelectric capacitor are respectively connected to the drain electrode of the tunneling field effect transistor and one of a plurality of bit lines. A voltage applied to the top plate of the hafnium oxide-based ferroelectric capacitor is controllable by controlling the gate electrode of the tunneling field effect transistor to select the storage element.

A control method for the proposed memory structure includes three steps of writing 0, writing 1, and reading.

The step of writing 0 to the memory structure includes: applying a first voltage to a bit line to which the memory structure is connected, applying a second voltage to a word line to which the memory structure is connected, and applying a third voltage to a plate line to which the memory structure is connected. In this way, a source junction of a tunneling field effect transistor in the memory structure is forward biased to provide drift-diffusion current as an on current. A ferroelectric polarization direction is switched to point to the top plate from the bit line, and 0 is written as the stored information in the memory structure.

Further, the first voltage is 0V, the second voltage is $V_D$, and the third voltage is $V_B$. A range of $V_D$ is 0V to 2V, and a range of $V_B$ is 0V to 6V, which are designed based on actual circuit requirements.

The step of writing 1 to the memory structure includes: applying a fourth voltage to the plate line to which the memory structure is connected, applying a fifth voltage to the word line to which the memory structure is connected, and applying a sixth voltage to the bit line to which the memory structure is connected. In this way, the source junction of the tunneling field effect transistor in the memory structure is reverse biased to provide band-to-band tunneling current as the on current. The ferroelectric polarization direction is switched to point to the bit line from the top plate, and 1 is written as the stored information in the memory structure.

Further, the fourth voltage is 0V, the fifth voltage is $V_A$, and the sixth voltage is $V_A$. A range of $V_A$ is 0V to 5V, which are designed based on an actual circuit requirements.

The step of reading the memory structure includes: floating the bit line to which the memory structure is connected, applying a seventh voltage to the word line to which the memory structure is connected, and applying an eighth voltage to the plate line to which the memory structure is connected. In this way, the tunneling field effect transistor in the memory structure is turned on, the ferroelectric polarization is switched, a voltage of the bit line rises, and data stored in the memory structure is read based on an voltage change of the bit line.

Further, the seventh voltage is $V_D$, and a range of the eighth voltage is $V_B$. A range of $V_D$ is 0V to 2V, and a range of $V_B$ is 0V to 6V, which are designed based on actual circuit requirements.

The memory structures provided in the present disclosure form a semiconductor memory array. The control method described above can be used on the memory structure in the array. Specifically, when a write operation is performed on the memory structures in the array, an operation of writing 0 is first performed on all memory structures in a selected row; and subsequently, an operation of writing 1 is performed on a required individual memory structure. After a read operation is performed on all memory structures in a row, a write back operation need to be performed on all memory structures in the same row.

The writing back for the semiconductor memory structure includes: applying a ninth voltage to a word line of a selected row in the semiconductor memory array, applying a tenth voltage to a corresponding plate line in the semiconductor memory array, applying an eleventh voltage to word lines and plate lines in remaining rows, applying a twelfth voltage to bit lines of memory structures in the row, whose stored information are 0, and applying the thirteenth voltage to bit lines of memory structures in the row, whose stored information is 1, so that the tunneling field effect transistors in all memory structures of the same row are turned on, the ferroelectric polarization of the memory structure whose original stored information is 0 is switched to point to the top plate from the bit line, and 0 is written back as the stored information in the semiconductor structure; applying a fourteenth voltage to the word lines in the corresponding row in the semiconductor memory array; applying a fifteenth voltage the corresponding plate line, so that the ferroelectric polarization of the memory structure whose original stored information is 1 is switched to point to the bit line from the top plate, and 1 is written back as the stored information in the semiconductor memory.

Further, the ninth voltage is $V_D$, the tenth voltage is $V_B$, the eleventh voltage is 0V, the twelfth voltage is 0V, the thirteenth voltage is $V_A$, the fourteenth voltage is $V_A$, and the fifteenth voltage is 0V. A range of $V_A$ is 0V to 5V, a range of $V_B$ is 0V to 6V, and a range of $V_D$ is 0V to 2V, which are designed based on actual circuit requirements.

The embedded semiconductor random access memory structure in the present disclosure uses the tunneling field effect transistor to perform reading, writing, and other operations on a ferroelectric storage element. Due to characteristics like unidirectional conduction and extremely low off-state current of the tunneling field effect transistor, the power consumption and the operating voltage of memory array can be reduced, the integration density of the memory array can be increased, and the retention of the memory can be enhanced. By using the hafnium oxide-based ferroelectric capacitor as the storage element, the memory window can be increased, the integration density of the memory array can be increased, and the retention of the memory can be enhanced. The embedded semiconductor random access memory structure of the present disclosure not only achieves lower power consumption, a lower operating voltage, and higher integration density, but also is very compatible for existing CMOS process integration. Moreover, the control method and a control circuit of the embedded semiconductor random access memory structure are also relatively simple.

In the figures:
1. Top metal plate; 2. Ferroelectric layer; 3. Bottom metal plate; 4. Lightly doped semiconductor substrate; 5. N-type doped drain region; 6. P-type doped source region; 7. Gate dielectric layer; 8. Gate; 9. Tunneling field effect transistor; 10. Ferroelectric storage element; 11. STI (shallow trench isolation); 12. Side wall; 13. Word line; 14. Bit line; 15. Plate line; 16. Via.

DETAILED DESCRIPTION OF THE EMBODIMENTS

An exemplary implementation of the present disclosure is further described below in conjunction with the accompanying drawings. It should be noted that embodiments are provided for helping further understanding of the present disclosure. However, a person skilled in the art would understand that it is possible that various replacements and modifications may be made without departing from the spirit and the scope of the present disclosure and the accompanying claims. Therefore, the present disclosure should not be limited to the contents disclosed in the embodiments. The protection scope of the present disclosure is subject to the scope defined in the claims.

Figure 1:
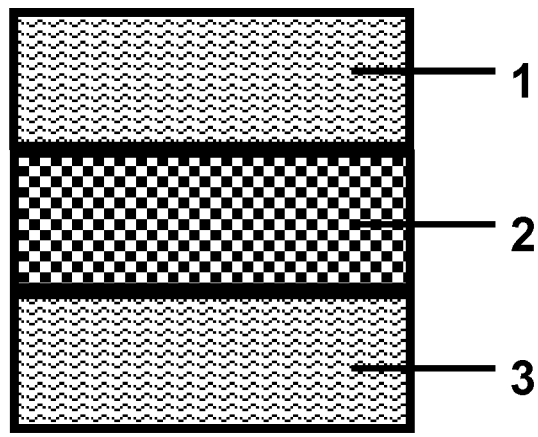
FIG. 1 is a cross-sectional view of a typical ferroelectric storage element.
Figure 2:
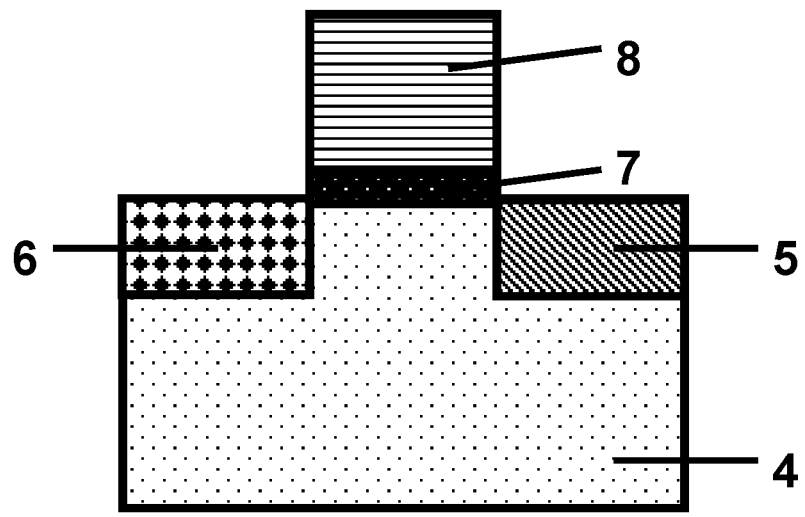
FIG. 2 is a cross-sectional view of a typical tunneling field effect transistor.
Figure 3:
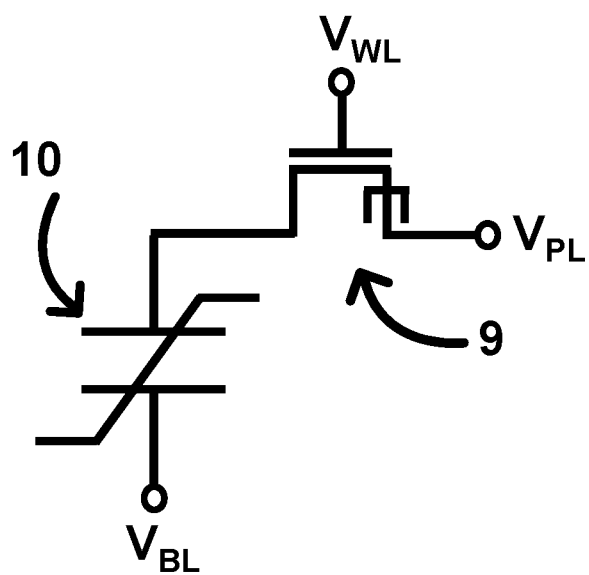
FIG. 3 is a schematic equivalent circuit diagram of an embedded semiconductor random access memory structure according to the present disclosure.
Figure 4:
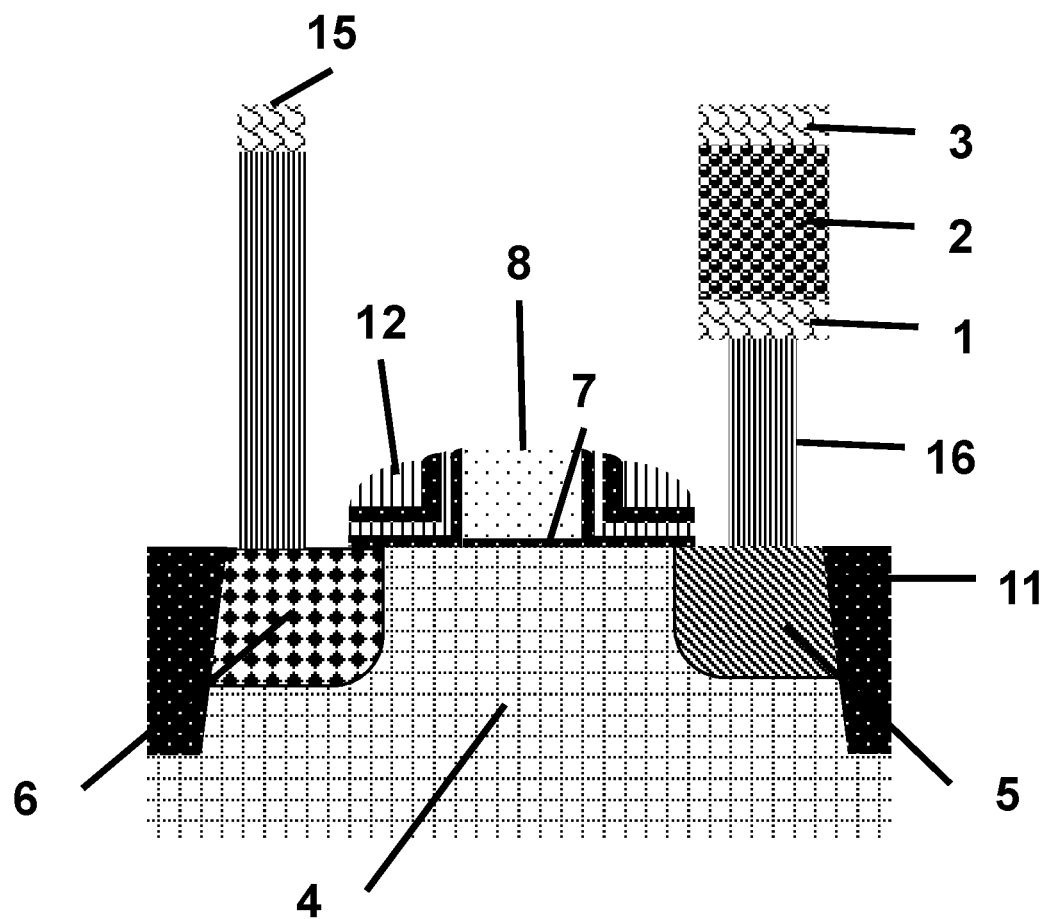
FIG. 4 is a cross-sectional view of an embedded semiconductor random access memory structure according to an embodiment of the present disclosure.

FIG. 1 is a cross-sectional view of a typical ferroelectric storage element. FIG. 2 is a cross-sectional view of a typical tunneling field effect transistor. FIG. 4 is a cross-sectional view of a memory structure according to the present disclosure. Merely a structure of a ferroelectric storage element and a structure of a tunneling field effect transistor that are provided in the present disclosure are shown in FIG. 1, FIG. 2, and FIG. 4, and various transformations may be made to the structures. For example, the ferroelectric storage element uses a trench structure, a stacked structure, or the like; and the tunneling field effect transistor uses a vertical nanowire structure, a fin-shaped gate structure, or the like.

Figure 5:
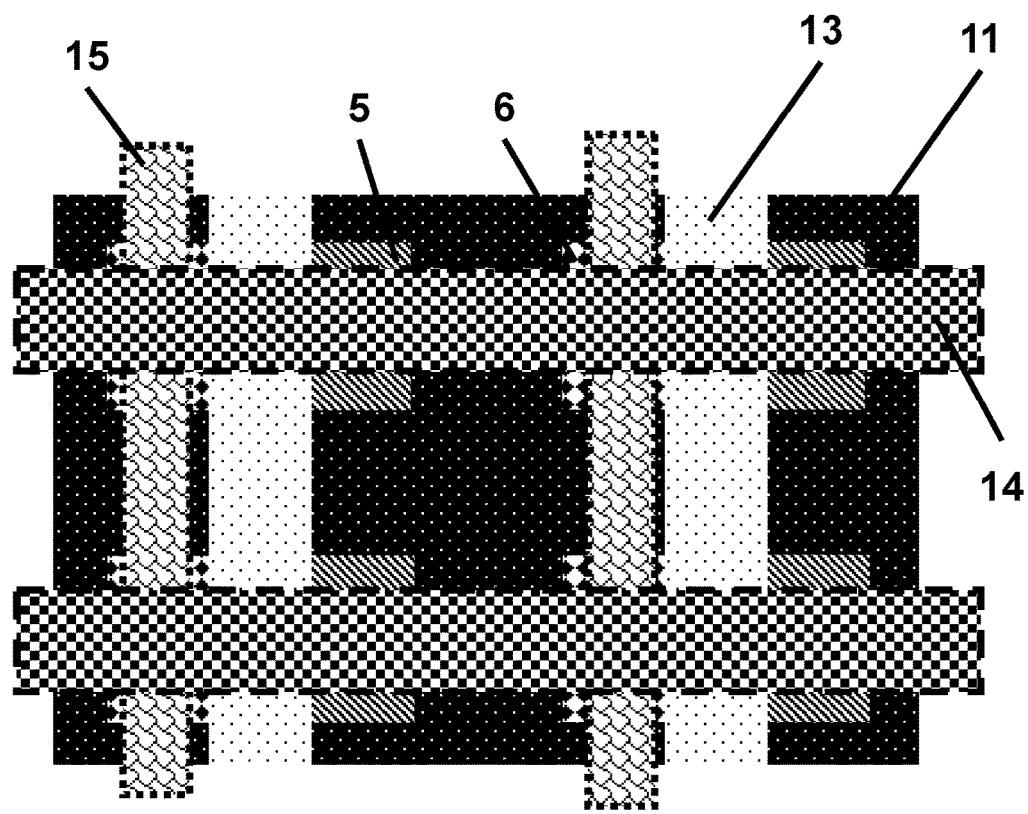
FIG. 5 is a top view of an embedded semiconductor random access memory structure according to an embodiment of the present disclosure.

FIG. 5 is a top view of a semiconductor memory array with interconnection lines according to the present disclosure. As shown in FIG. 4 and FIG. 5, a lightly doped semiconductor substrate may be in P-type or N-type. A gate dielectric is $SiO_2$, or high-k dielectric such as $HfO_2$ or $Hf_xLa_yO$. A gate conductive layer is made of n-type doped polycrystalline silicon, or a metal material such as TiN or TaN. A side-wall structure is made of dielectric materials such as silicon dioxide and silicon nitride. A p-type heavily doped region serves as a source of the tunneling field effect transistor and is connected to the plate line. A n-type heavily doped region serves as a drain of the tunneling field effect transistor and is connected to the storage element. A hafnium oxide-based ferroelectric material, the top metal plate, and the bottom metal plate together forming the storage element. The material of the top and bottom metal plate can be TiN, TaN, or other metal material. In a read/write operation, a voltage applied to the top electrode can be controllable by controlling a gate electrode of the tunneling field effect transistor, so as to select the storage element.

Figure 6:
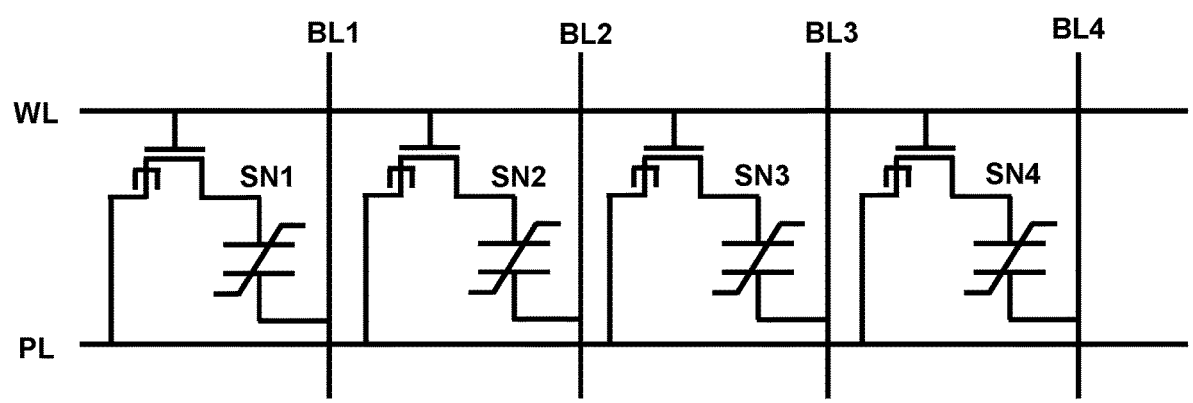
FIG. 6 is an equivalent circuit diagram of an embedded semiconductor random access memory structure according to an embodiment of the present disclosure.

FIG. 6 is an equivalent circuit diagram of a control method for a memory structure according to the present disclosure. As shown in FIG. 6, a bit line BL is connected to the bottom plate of the ferroelectric storage element, a word line WL is connected to the gate of the tunneling field effect transistor, and a plate line PL is connected to the source of the tunneling field effect transistor. The top metal plate of the ferroelectric storage element is connected to the drain of the tunneling field effect transistor at the SN node (storage node). A memory array can be formed by repeat the above memory structures as shown in FIG. 4. FIG. 7, FIG. 8, FIG. 9, and FIG. 10 are equivalent circuit diagrams of performing writing 0, writing 1, reading, and writeback on a semiconductor memory array, respectively.

Specifically, when writing information into the semiconductor memory array, an operation of writing 0 needs to be first performed on all memory structures in the selected row; and subsequently, an operation of writing 1 is performed on the required individual memory structures.

Figure 7:
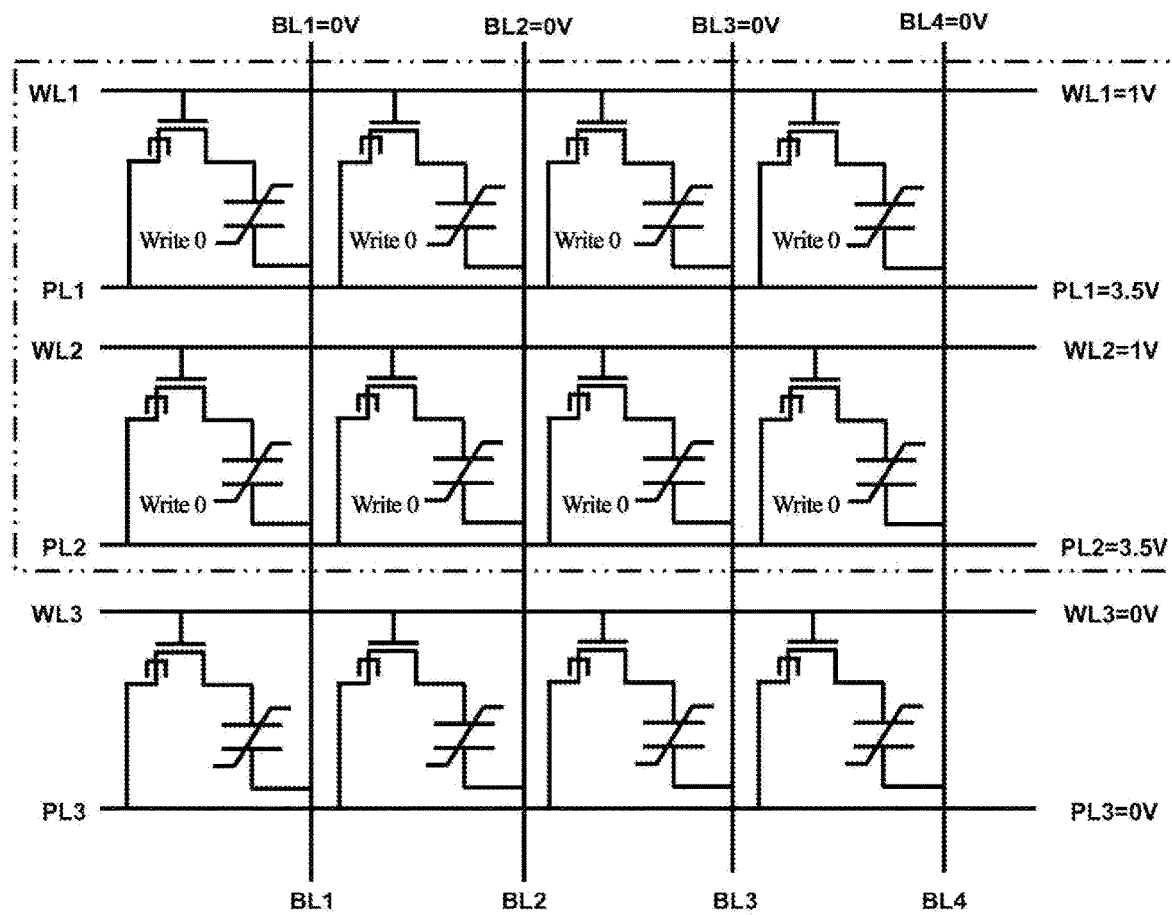
FIG. 7 is an equivalent circuit diagram of writing 0 through a control method for a semiconductor memory structure array according to an embodiment of the present disclosure.

Steps of writing 0 for the semiconductor memory array are shown in FIG. 7:
applying a voltage of 0V to all bit lines BLn (n=1, 2, 3, and 4);
applying a voltage of 1V to a word line WLn (n=1 and 2), and applying a voltage of 0V to the remaining word line WL3; and
applying a voltage of 3.5V to a plate line PLn (n=1 and 2), and applying a voltage of 0V to the remaining plate line PL3.

When the voltage of word line is 1V and the voltage of the plate line is 3.5V, the source junction of the tunneling field effect transistor is forward biased, and a drift-diffusion current will transfer the voltage of the plate line to the top metal plate of the ferroelectric storage element. When the voltage of the bit line is 0V, a voltage across the ferroelectric storage element is greater than its coercive voltage, the ferroelectric polarization is switched to point to the top plate from the bit line, and the stored information of a corresponding memory cell becomes 0.

Figure 8:
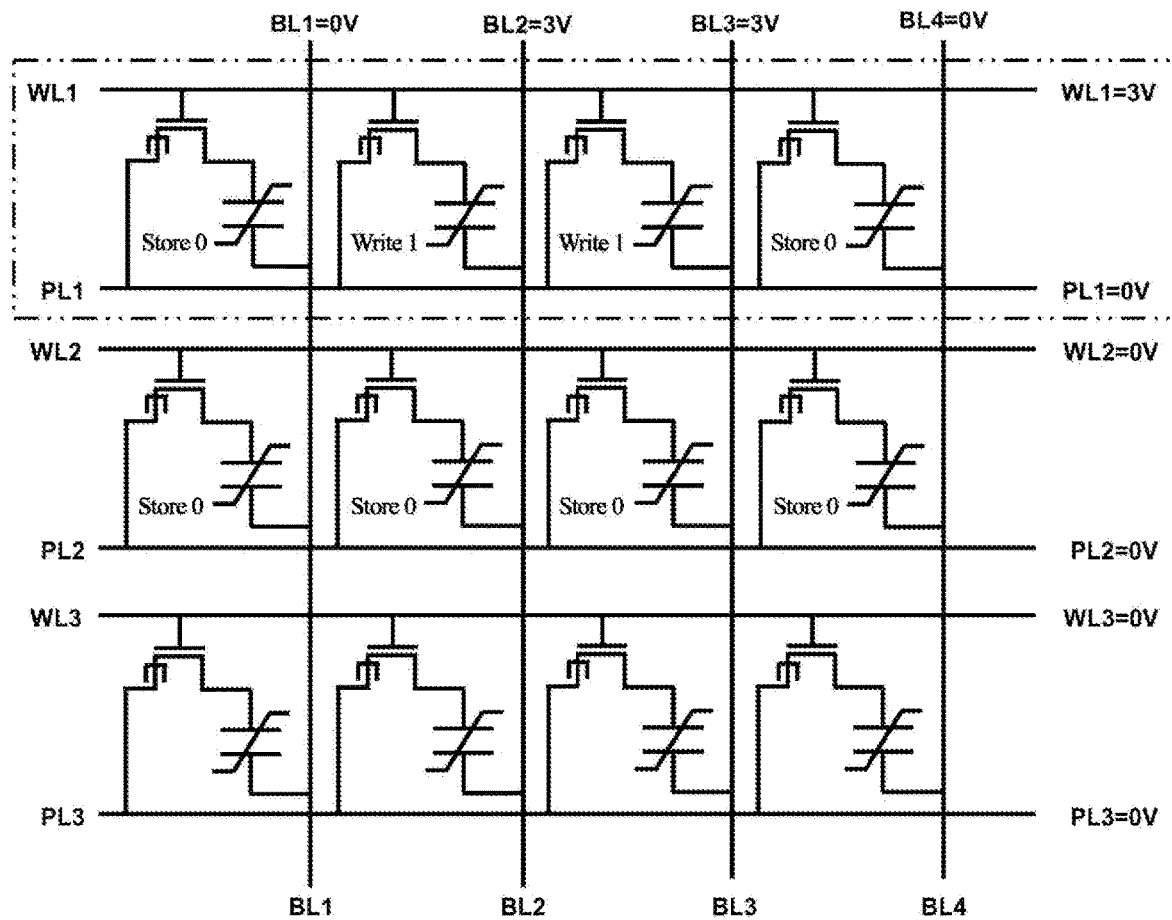
FIG. 8 is an equivalent circuit diagram of writing 1 through a control method for a semiconductor memory array according to an embodiment of the present disclosure.

Steps of writing 1 for the semiconductor memory array are shown in FIG. 8:
reducing the voltage on the plate line PLn (n=1 and 2) to 0V;
increasing the voltage on the word line WL1 to 3V, and reducing voltages on remaining word lines WLn (n=2 and 3) to 0V; and
increasing voltages on bit lines, such as BL2 and BL3, to 3V, corresponding to individual memory structures to which 1 is to be written, and maintaining voltages on other bit lines, such as BL1 and BL4, at 0V.

For the memory structure to which 1 is to be written, a source junction of a tunneling field effect transistor is reverse biased, the ferroelectric polarization is switched to point to the bit line from the top plate, and the stored information becomes 1. For the memory structures whose information is kept as 0, a voltage across their ferroelectric storage elements becomes 0V, where the ferroelectric polarization would not be switched, and the stored information is kept as 0. After the operation of writing 1 is completed, the voltage of the bit line BLn (n=2 and 3) and the voltage of the word line WL1 are sequentially put down to 0V, thereby ensuring that the information in each memory structure retains the written information unchanged. Subsequently, each memory structure enters a standby state.

Figure 9:
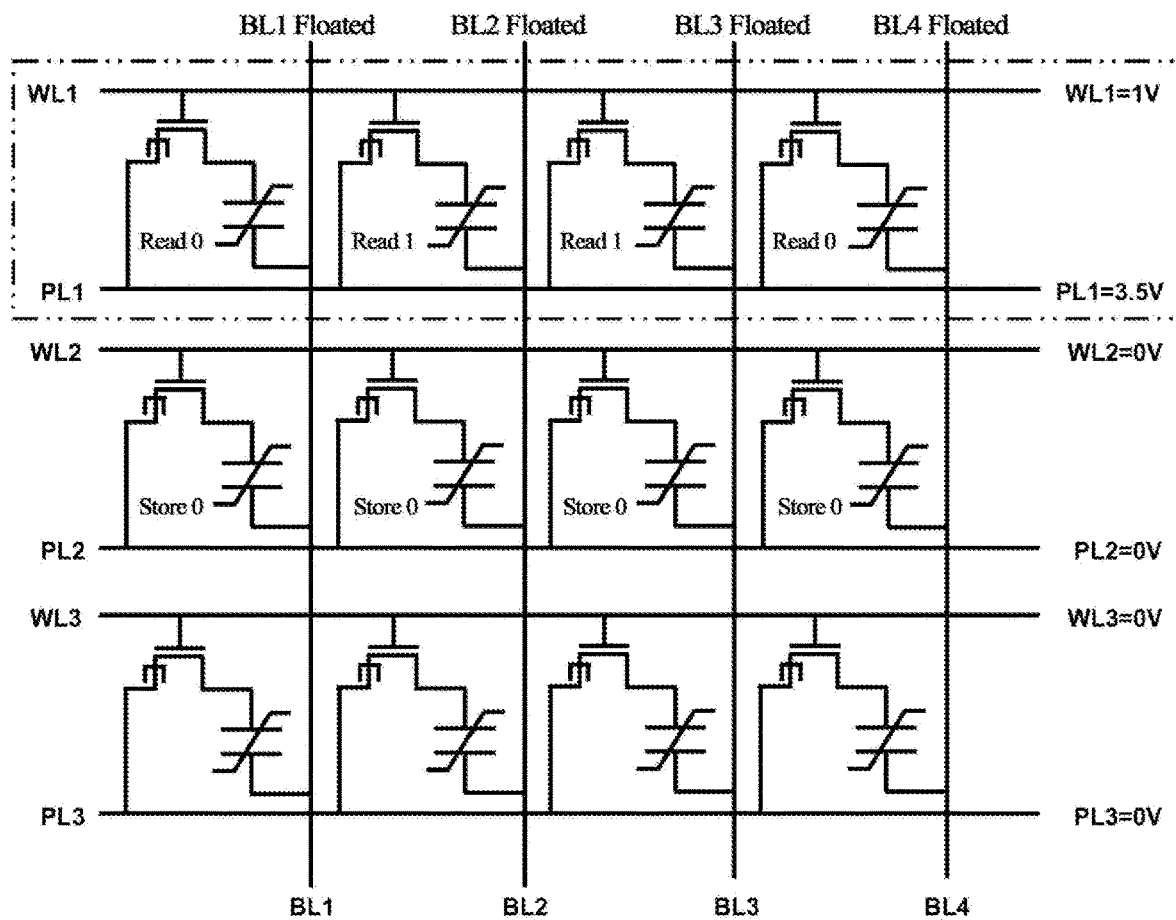
FIG. 9 is an equivalent circuit diagram of reading through a control method for a semiconductor memory array according to an embodiment of the present disclosure.

Steps of reading the semiconductor memory array are shown in FIG. 9:

setting all bit lines BLn (n=1, 2, 3, and 4) to a floating state;

applying a voltage of 1V to the word line WL1, and applying a voltage of 0V to remaining word lines WLn (n=2 and 3); and applying a voltage of 3.5V to the plate line PL1, and applying a voltage of 0V to remaining plate lines PLn (n=2 and 3).

Similar to the operation of writing 0, in this case, the voltage applied to each ferroelectric storage element in the row WL1 exceeds a coercive voltage of the ferroelectric storage element, and the ferroelectric polarization is switched to point to the top plate from the bit line. An amount of charges in the ferroelectric storage element changes, and the changed amount of charges is redistributed between the ferroelectric capacitor and a bit-line capacitor. As a result, the voltage of the bit line increases. For the memory structure in which 1 is stored, a change of ferroelectric polarization may be greater than that of the memory structure in which 0 is stored, and the final value of the voltage of the bit line thereof may also be higher than that of the bit line to which the memory structure is connected in which 0 is stored. The information stored in the memory structure may be read by reading a voltage value of the bit line in a stable state.

Figure 10:
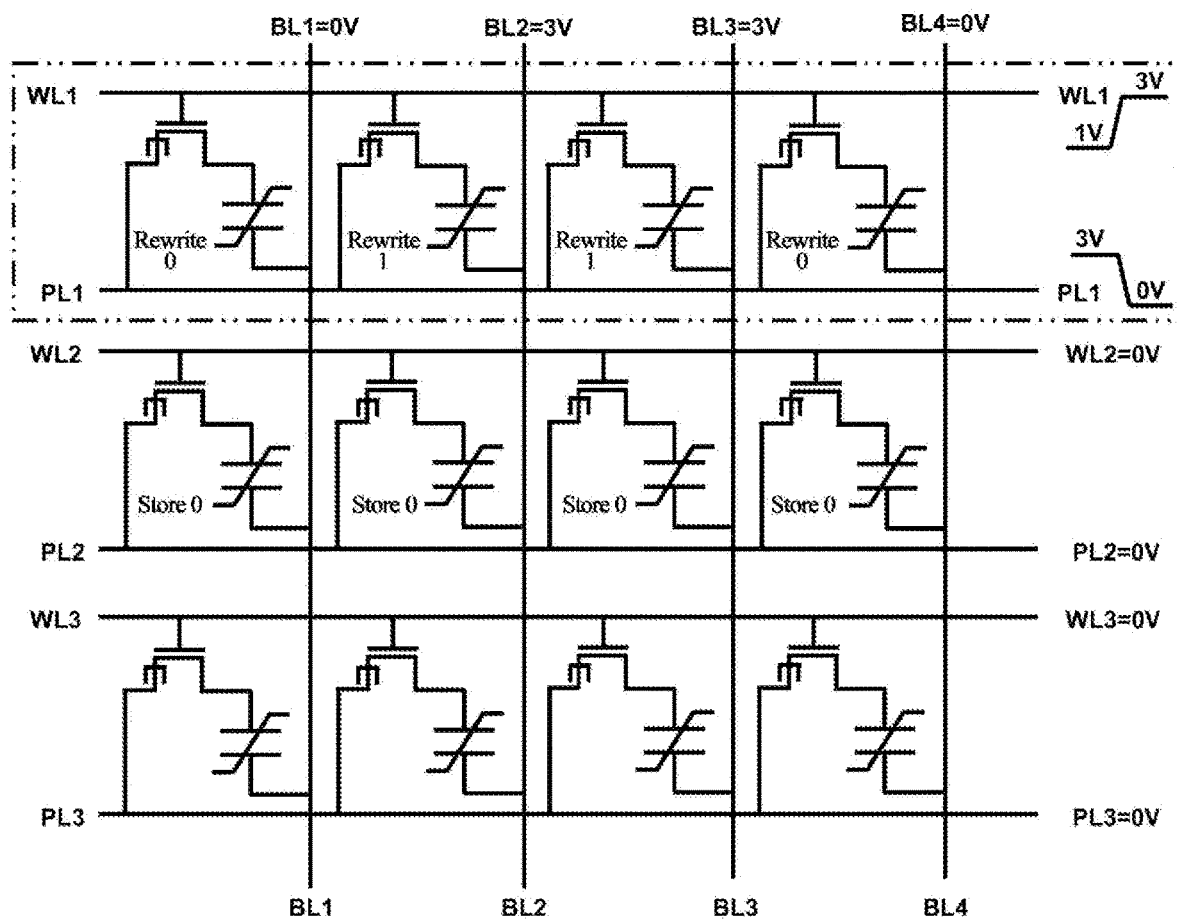
FIG. 10 is an equivalent circuit diagram of rewriting through a control method for a semiconductor memory array according to an embodiment of the present disclosure.

The information stored in the memory structure is destroyed due to the operation of reading the semiconductor memory array, and as a result, the information in the memory structure needs to be written back. Steps of writing back the semiconductor memory array are shown in FIG. 10:

setting the voltage of each word line consistent with the voltage during the reading operation, that is, applying a voltage of 1V to the word line WL1, and applying a voltage of 0V to the remaining word lines WLn (n=2 and 3); and setting the voltage of the plate line PL1 consistent with the voltage during the reading operation, that is, applying a voltage of 3.5V to the plate line PL1, and applying a voltage of 0V to the remaining plate lines PLn (n=2 and 3).

The voltages of the respective bit lines are respectively pulled up to 3V or pulled down to 0V by a sense amplifier in a peripheral circuit of the memory array depending on the stored information in the respective connected memory structures. Specifically, if the stored information in the memory structure is 1, a voltage of the corresponding bit line may be pulled up to 3V. If the stored information in the memory structure is 0, the voltage of the corresponding bit line may be pulled down to 0V.

For a storage element for which a voltage of the bit line is 0V, such as the storage elements connected to BL1 and BL4, due to the voltage of 3.5V on the plate line PL1, the voltage across the ferroelectric storage element is higher than the coercive voltage, the ferroelectric polarization is switched to point to the top plate from the bit line again, and the stored information is write back to 0. After the operation of writing back 0 is completed, the voltage of the word line WL1 is increased to 3V and the voltage of the plate line PL1 is decreased to 0V, for a storage element for which the connected bit line is 3V, such as memory structures connected to BL2 and BL3, the ferroelectric polarization is switched to point to the bit line from the top metal plate again, and the stored information is written back as 1, where in the memory structures connected to BL1 and BL4, a ferroelectric polarization direction remains unchanged, and the stored information remains 0. After the operation of writing back 1 is completed, the voltages of the bit lines BLn (n=2 and 3) and the voltage of the word line WL1 need to be reduced to 0V sequentially, thereby retaining the information in each memory structure unchanged, where each memory structure enters a standby state.

Although the present disclosure has disclosed the preferred embodiments as above, the preferred embodiments are not intended to limit the present invention. Any person skilled in the art may make many possible changes and modifications to the technical solutions of the present disclosure or modify the technical solutions as equivalent embodiments by equivalent changes in view of the method and the technical content disclosed above, without departing from the scope of the technical solutions of the present disclosure. Therefore, any simple amendments, equivalent changes, and modifications made to the foregoing embodiments based on the technical spirit of the present disclosure still fall within the protection scope of the technical solutions of the present disclosure, without departing from the content of the technical solutions of the present disclosure.

What is claimed is:

1. A control method for an embedded semiconductor random access memory structure comprising one hafnium oxide-based ferroelectric capacitor as a storage element and one tunneling field effect transistor configured to control the storage element, wherein the hafnium oxide-based ferroelectric capacitor comprises a hafnium oxide-based ferroelectric material layer, a top plate, and a bottom plate; and the tunneling field effect transistor comprises a source electrode, a drain electrode, a lightly-doped channel region, and a gate electrode, wherein the gate electrode of the tunneling field effect transistor is connected to one of a plurality of word lines, the source electrode is connected to one of a plurality of plate lines, two terminals of the hafnium oxide-based ferroelectric capacitor are respectively connected to the drain electrode of the tunneling field effect transistor and one of a plurality of bit lines; and wherein a voltage applied to the top plate of the hafnium oxide-based ferroelectric capacitor is controllable by controlling the gate electrode of the tunneling field effect transistor to select the storage element, wherein the control method comprises three steps of writing 1, writing 0, and reading, wherein the step of writing 0 includes: applying a first voltage to a bit line to which the memory structure is connected, applying a second voltage to a word line to which the memory structure is connected, and applying a third voltage to a plate line to which the memory structure is connected, so that a source junction of the tunneling field effect transistor in the memory structure is forward biased to provide a drift-diffusion current as an on current, wherein a ferroelectric polarization direction is switched to point to the top plate from the bit line, and 0 is written as stored information in the memory structure;

the step of writing 1 includes: applying a fourth voltage to the plate line to which the memory structure is connected, applying a fifth voltage to the word line to which the memory structure is connected, and applying a sixth voltage to the bit line to which the memory structure is connected, so that the source junction of the tunneling field effect transistor in the memory structure is reverse biased to provide a band-to-band tunneling current as the on current, wherein the ferroelectric polarization direction is switched to point to the bit line from the top plate, and 1 is written as the stored information in the memory structure; and the step of reading includes: floating the bit line to which the memory structure is connected, applying a seventh voltage to the word line to which the memory structure is connected, and applying an eighth voltage to the plate line to which the memory structure is connected, so that the tunneling field effect transistor in the memory structure is turned on, the ferroelectric polarization is switched, a voltage of the bit line rises and data stored in the memory structure is read based on an amount of voltage change of the bit line.

2. The control method according to claim 1, wherein the first voltage is 0V, the second voltage is VD in a range of 0V to 2V, and the third voltage is VB in a range of 0V to 6V.

3. The control method according to claim 1, wherein the fourth voltage is 0V, the fifth voltage is VA, and the sixth voltage is VA, where VA is in a range of 0V to 5V.

4. The control method according to claim 1, wherein the seventh voltage is VD in a range of 0V to 2V, and the eighth voltage is VB in a range of 0V to 6V.

5. The control method according to claim 1, wherein a semiconductor memory array is formed by repeating the embedded semiconductor random access memory structures, wherein when a write operation is performed on the memory structures in the semiconductor memory array, an operation of writing 0 is first performed on all memory structures in a selected row; subsequently, an operation of writing 1 is performed on the required memory structures; and wherein after a read operation is performed on all memory structures in a row, a write back operation need to be performed on all memory structures in the same row.

6. The control method according to claim 5, wherein the write back operation includes: applying a ninth voltage to the required word line in the semiconductor memory array, applying a tenth voltage to a corresponding plate line in the semiconductor memory array, applying an eleventh voltage to word lines and plate lines in remaining rows, applying a twelfth voltage to bit lines of memory structures in the row, whose stored information are 0, and applying the thirteenth voltage to bit lines of memory structures in the row, whose stored information is 1, so that tunneling field effect transistors in all memory structures in the row are turned on, ferroelectric polarization of the memory structure whose original stored information is 0 is switched to point to the top plate from the bit line, and 0 is written back as the stored information in the semiconductor memory; applying a fourteenth voltage to the word lines in the corresponding row in the semiconductor memory array; applying a fifteenth voltage to the corresponding plate line, so that ferroelectric polarization of the memory structure whose original stored information is 1 is switched to point to the bit line from the top plate, and 1 is written back as the stored information in the semiconductor memory.

7. The control method according to claim 6, wherein the ninth voltage is VD, the tenth voltage is VB, the eleventh voltage is 0V, the twelfth voltage is 0V, the thirteenth voltage is VA, the fourteenth voltage is VA, and the fifteenth voltage is 0V, where VA is in a range of 0V to 5V, VB is in a range of 0V to 6V, and VD is in a range of 0V to 2V.

* * * * *